US006291402B1

(12) United States Patent
Jin et al.

(10) Patent No.: US 6,291,402 B1
(45) Date of Patent: Sep. 18, 2001

(54) METHOD OF MAKING A SUPERCONDUCTIVE OXIDE BODY

(75) Inventors: Sungho Jin, Millington; Richard Curry Sherwood, New Providence; Thomas Henry Tiefel, Piscataway; Robert Bruce van Dover, Berkeley Heights, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 07/426,485

(22) Filed: Oct. 23, 1989

Related U.S. Application Data

(63) Continuation of application No. 07/316,544, filed on Feb. 23, 1989, now abandoned, which is a continuation of application No. 07/046,825, filed on May 5, 1987, now abandoned.

(51) Int. Cl.$^7$ ..................................................... B05D 5/12
(52) U.S. Cl. ............................................ 505/100; 427/62
(58) Field of Search ................................ 505/1, 739, 742

(56) References Cited

U.S. PATENT DOCUMENTS

| | | | | |
|---|---|---|---|---|
| 3,796,553 | * | 3/1974 | Daunt ............................... | 174/126 S |
| 3,815,224 | * | 6/1974 | Pickus et al. ..................... | 174/126 S |
| 4,050,147 | * | 9/1977 | Winter et al. .......................... | 29/599 |
| 4,585,696 | * | 4/1986 | Dustmann et al. ............... | 174/126 S |
| 4,826,808 | * | 5/1989 | Yurek et al. .............................. | 505/1 |
| 4,892,861 | * | 1/1990 | Ray ........................................ | 505/1 |
| 4,952,554 | | 8/1990 | Jin et al. ................................. | 505/1 |

FOREIGN PATENT DOCUMENTS

| | | | | |
|---|---|---|---|---|
| 0277749 | | 10/1988 | (EP) ............................ | H01L/39/12 |
| 085814 | * | 7/1981 | (JP) . | |

OTHER PUBLICATIONS

"Problems in the Production of YBa$_2$Cu$_3$O$_x$ Superconducting Wire", by R. W. McCallum et al., *Advanced Ceramic Materials*, vol. 2. No. 3B, Special Issue, 1987, pp. 388–400.
"Effect of Transition–Metal Elements on the Superconductivity of Y–Ba–Cu–O", by G. Xiao et al., *Physical Review B*, vol. 35, No. 16, Jun. 1, 1987, pp. 8782–8784.
*Superconducting Material Science, Mettallurgy, Fabrications, and Applications*, Plenum Press 1981.
*Physical Review Letters*, vol. 58, No. 9, Mar. 2, 1987, pp. 911–912, "High–Pressure Study of the New Y–Ba–Cu–O Superconducting Compound System" by P. H. Hor et al.
*Physical Review Letters*, vol. 58, No. 16, Apr. 20, 1987, pp. 1676–1679, "Bulk Superconductivity at 91K in Single–Phase Oxygen–Deficient Perovskite Ba$_2$YCu$_3$O$_{9-\delta}$" by R. J. Cava et al.
*Superconductor Applications: Squids and Machines*, Plenum Press 1977 by B. B. Schwartz et al.
*Physica*, vol. 126 (1984) 275–279, Superconductivity in Ba (Pb, Bi) O$_3$.
*Zeitschr. f. Physik B—Condensed Matter*, vol. 64, 189 (1986) "Possible High T$_C$ Superconductivity in the Ba–La–Cu–O System".

(List continued on next page.)

*Primary Examiner*—Benjamin L. Utech
(74) *Attorney, Agent, or Firm*—Eugen E. Pacher

(57) ABSTRACT

Some mechanical, electrical, and thermal properties of high T$_c$ superconductors such as (Ba, Y) cuprates can be substantially improved by the dispersal of an appropriate metal in the superconductive body. For instance, mixing Ag particles with superconductive powder of nominal composition Ba$_2$YCu$_3$O$_7$ and processing the mixture in the conventional manner can produce superconductive bodies having T$_c$ of about 93 K and substantially greater fracture strength and normal state electrical and thermal conductivity than otherwise identical bodies that do not contain Ag particles.

14 Claims, 2 Drawing Sheets

OTHER PUBLICATIONS

*Physical Review Letters*, vol. 58, No. 9, Mar. 2, 1987, pp. 908–910, "Superconductivity at 93K in a New Mixed–Phase Y–Ba–Cu–O Compound System at Ambient Pressure" by M. K. Wu et al.

European Search Report, EP 88 30 3802, 4 pages.

"Composition Dependence of Superconductivity in Y–Ba–(Ag, Cu) –O System" by Y. Saito et al., *Japanese Journal of Applied Physics*, vol. 26, No. 5, May 1987, pp. L832–L833.

"Composition Dependence of the High Temperature Superconductivity in 9Ba, Sr)–La–(Hg, Ag)–Cu–O System with $K_2NiF_4$–Type Structure", by Y. Saito et al., *Japanese Journal of Applied Physics*, vol. 26, No. 3, Mar. 1987, pp. 1223–1224.

* cited by examiner

METHOD OF MAKING A SUPERCONDUCTIVE OXIDE BODY

This application is a continuation of application Ser. No. 07/316,544, filed on Feb. 23, 1989 now abandoned, which is a continuation application Ser. No. 07/046,825, filed May 5, 1987, now abandoned.

FIELD OF THE INVENTION

This invention pertains to bodies comprising a superconductive compound such as an oxide.

BACKGROUND OF THE INVENTION

From the discovery of superconductivity in 1911 to the recent past, essentially all known superconducting materials were elemental metals (e.g., Hg, the first known superconductor) or metal alloys and intermetallic compounds (e.g., $Nb_3Ge$, probably the material with the highest transition temperature $T_c$ known prior to 1986).

Recently, superconductivity was discovered in a new class of materials, namely, metal oxides. See, for instance, B. Batlogg, *Physica*, Vol. 126, 275 (1984), which reviews superconductivity in barium bismuth lead oxide, and J. G. Bednorz and K. A. Muller, *Zeitschr. f. Physik B—Condensed Matter*, Vol. 64, 189 (1986), which reports superconductivity in lanthanum barium copper oxide.

The latter report stimulated worldwide research activity, which very quickly resulted in further significant progress. The progress has resulted, inter alia, to date in the discovery that compositions in the Y—Ba—Cu—O system can have superconductive transition temperatures $T_c$ above 77 K, the boiling temperature of liquid $N_2$ (see, for instance, M. K. Wu et al, *Physical Review Letters*, Vol. 58, Mar. 2, 1987, page 908; and P. H. Hor et al, ibid, page 911). Furthermore, it has resulted in the identification of the material phase that is responsible for the observed high temperature superconductivity, and in the discovery of compositions and processing techniques that result in the formation of bulk samples of material that can be substantially single phase material and can have $T_c$ above 90 K (see, for instance, R. J. Cava et al, *Physical Review Letters*, Vol. 58(16), pp. 1676–1679).

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be perhaps one of the most advantageous cryogenic refrigerant, and attainment of superconductivity at liquid nitrogen temperature was a long-sought goal which until very recently appeared almost unreachable.

Although this goal has now been attained, there still exist barriers that have to be overcome before the new high $T_c$ superconductive compounds can be utilized in many technological applications. In particular, the oxide superconductive bodies are relatively brittle and mechanically weak, and have relatively low electrical and thermal conductivities in the normal state. Thus, it would be desirable to be able to produce superconductive oxide bodies having improved mechanical, electrical and/or thermal properties. This application discloses such bodies, and a technique for producing them.

For a general overview of some potential applications of superconductors see, for instance, B. B. Schwartz and S. Foner, editors, *Superconductor Applications: SQUIDS and MACHINES*, Plenum Press 1977; and S. Foner and B. B. Schwartz, editors, *Superconductor Material Science, Metallurgy, Fabrications, and Applications*, Plenum Press 1981. Among the applications are power transmission lines, rotating machinery, and superconductive magnets for e.g., fusion generators, MHD generators, particle accelerators, levitated vehicles, magnetic separation, and energy storage, as well as junction devices and detectors. It is expected that many of the above and other applications of superconductivity would materially benefit if high $T_c$ superconductive material could be used instead of the previously considered relatively low $T_c$ materials. Since in many of the applications the current through the superconductive body will be interacting with large magnetic fields, the body will experience large Lorentz forces. In these and other cases, superconductive bodies of improved mechanical properties, including toughness and strength, could be advantageously used.

Improved mechanical properties are of course desirable in general, since in many cases the superconductive body will have to withstand stresses due to handling, installing, and the like, and always will have to withstand stresses due to thermal contraction and expansion. Furthermore, it is typically desirable for the normal-state electrical and thermal conductivities of superconductive body such as wire or ribbon to be relatively high, such that, in the case of local loss of superconductivity, heat generation is minimized and the generated heat can be rapidly conducted away.

The prior art knows several techniques for producing superconductive oxide bodies. See, for instance, R. J. Cava et al, *Physical Review Letters*, Vol. 58, page 1676 (1987), U.S. patent application Ser. No. 025,913, filed Mar. 16, 1987 for E. M. Gyorgy et al, titled "Apparatus Comprising a Ceramic Superconductive Body, and Method for Producing Such a Body", and U.S. patent application Ser. No. 034,117, filed Apr. 1, 1987 for S. Jin et al, titled "Apparatus and Systems Comprising a Clad Superconductive Oxide Body, and Method for Producing Such a Body", both incorporated herein by reference. The former patent application discloses a technique for making superconductive oxide bodies having at least one small dimension (e.g., sheetings, tapes, thin rods, and the like). The technique comprises mixing the oxide powder with a binder, and heating the "green" body under conditions such that the resulting ceramic body is superconductive.

The latter patent application discloses a technique for making an elongate normal metal-clad oxide superconductive body, e.g., a wire or tape, which comprises forming an intermediate body that comprises a cladding material surrounding a quantity of oxide powder, forming elongate body by reducing the cross section of the intermediate body (e.g., by rolling or by drawing through dies), and by heat treating the elongate body under conditions such that sintering of the oxide powder occurs, and such that the sintered oxide body is superconductive.

In general, the techniques insure that the oxide body is not "poisoned" during the heat treatment, that the oxide has the appropriate crystal structure, and that the oxygen content of the heat treated oxide is in the range that is associated with superconductivity in the oxide.

DEFINITIONS

The (Ba, Y) cuprate system herein is the class of oxides of nominal general formula $Ba_{2-x}M_{1-y}X_{x+y}Cu_3O_{9-\delta}$, where M is one of Y, Eu, or La, and X is one or more optional element different from Ba and M and selected from the elements of atomic number 57–71, Sc, Ca, and Sr. Typically x+y is in the range 0–1 (with Ba and M being at least 50% unsubstituted), and typically $1.5<\delta<2.5$. In a particular preferred subclass of the (Ba, Y) cuprate system $0\leq x\leq 0.2$ and $0\leq y<0.1$, with the optional X being one or more of Ca, Sr, Lu and Sc.

The (La, Ba) cuprate system herein is the class of oxides of nominal general formula $La_{2-x}M_xCuO_{4-\epsilon}$, where M is one or more divalent metals (e.g., Ba, Sr, Ca), and $x\geq 0.05$, and $0\leq\epsilon\leq 0.5$.

A "metal-containing" superconductive material herein is a multicomponent superconductive material comprising one or more superconductive chemical compounds (e.g., a (Ba, Y) cuprate) and one or more metal (e.g., elemental metal, alloy, or composite metal particles) components. Typically the metal components) is (are) dispersed throughout the superconductive material. The metal component is not necessarily homogeneously distributed but can, for instance, have a preferred orientation (e.g., metal fibers oriented substantially parallel to each other).

A "metal-free" superconductive material herein is a superconductive material that comprises one or more superconductive compounds (including metal oxides such as (B, Y) cuprate) but does not contain any metal component as defined above.

A "normal" metal herein is a metal that does not become superconductive at temperatures of technological interest, typically at temperatures of 2 K and above.

THE INVENTION

We have discovered that several of the properties (including mechanical properties such as strength and toughness, electrical properties such as normal state conductivity, and thermal properties such as normal state heat conductivity) of superconductive bodies (typically oxide bodies) can be improved by addition of appropriate metal(s) to the superconductive material body prior to heat treatment, and appropriate heat treatment of the metal-containing body. Superconductive bodies according to the invention typically have at least 10%, but preferably at least about 50%, higher fracture load or toughness in a standard 3-point bend test, as compared to an otherwise identical body free of added metal, and typically have substantially increased normal state electrical conductivity.

In many cases the superconductive material is an oxide powder, but the invention is not so limited. For instance, it can also be practiced with superconductive oxide films (thin or thick) or layers deposited by, e.g., sputtering, evaporation, chemical precipitation, or plasma deposition. Furthermore, it is expected that the invention could be advantageously practiced with other (non-oxide) superconductive chemical compounds, should such compounds exist. However, for ease of exposition we will frequently refer herein to superconductive oxides. This usage is not intended to imply limitation of the invention to oxides.

The metal is added to the superconductive material in any appropriate manner, e.g., by admixture of metal powder or of a decomposable metal-containing compound, addition of a metal-containing slurry or solution, by co-sputtering or other co-deposition, or by ion implantation.

Preferably the metal that is added to the superconductive material is a relatively ductile elemental metal or metal alloy that is benign with respect to the superconductive properties of the oxide (i.e., the presence of the metal does not substantially affect (poison) the superconductive properties of the material). However, under some circumstances some effect on these properties may be acceptable. For instance, for superconductive materials having a relatively high transition temperature $T_c$, ($T_c>>77$ K) addition of metal or metals that lower $T_c$ or broaden the transition may be commercially acceptable, especially if the metal-containing superconductive body becomes fully superconductive above 77 K.

Ag and Au are metals that are benign with respect to superconductive oxides such as the members of the (Ba, Y) cuprate system and of the (La, Ba) cuprate system, and Ag (including base metal particles coated with Ag) is expected to have broad utility as a property-improving additive of high $T_c$ superconductive bodies.

Figure 1:
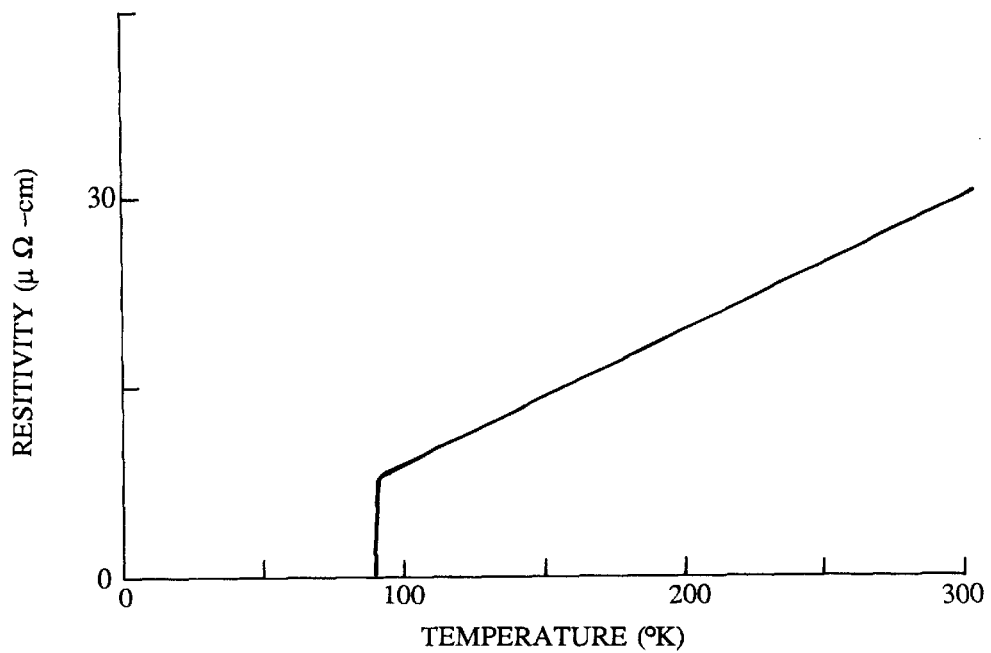
FIG. 1 shows the electrical resistance of an exemplary body according to the invention as a function of temperature.

A currently preferred exemplary embodiment of the invention uses Ag powder in conjunction with (Ba, Y) cuprate powder. In members of this system the admixture of up to at least 40% by volume Ag has substantially no effect on the transition temperature, as is exemplified by the curve of resistance vs. temperature shown in FIG. 1. Similarly, the magnetic susceptibility of these Ag/oxide bodies is substantially the same as in corresponding pure oxide bodies, taking account of the volume dilution effect due to the presence of the Ag.

As previously indicated, it is generally desirable that a metal-containing superconductive body according to the invention have a high transition temperature, but in many cases it may not be necessary that the transition be as sharp as it is in the corresponding pure compound. Addition of many metals other than Ag and Au (e.g., Cu, Fe, Pt, Zn, Sn, Ni, Co, Ti, Al, Mo, Cr, Nb, Zr) to superconductive oxide powders (and possibly other high $T_c$ compounds) may result in improved mechanical strength and possibly other properties of bodies produced from the mixture, and the possible resulting degradation of the superconductive properties may be commercially acceptable.

Bodies according to the invention typically comprise after firing about 50–99% by volume superconductive chemical compound (preferably 50–95%) and typically about 1–50% by volume (preferably 5–50% b.v.) metal, metals or alloys. However, under some circumstances the amount of superconductive material in an inventive body could also be substantially less than 50% b.v. This could, for instance, be the case if the superconductive material is in the form of fibers or filaments, or forms a network. As will be appreciated, before firing metal-containing bodies according to the invention frequently comprise further constituents, e.g., an organic binder. Although the oxide in the fired body preferably is substantially single phase material, the invention can also be practiced with oxide compositions that do not result in single phase material.

Frequently the metal is added directly to appropriately sized oxide powder. However, this is not a requirement, and under some circumstances it may be desirable to comminute a metal/oxide mixture. Furthermore, the metal need not be in powder form but may be in any other appropriate form, e.g., flakes, filaments, woven wool, or singular or multiple, flat or round, fibers. In elongate bodies fibers typically are oriented substantially longitudinally. The average size of the metal particles advantageously is smaller than that of the oxide powder particles, exemplarily in the range 0.01–10 $\mu$m, whereas fibers typically will have dimensions (e.g., diameters or width) in the range 1–100 $\mu$m prior to elongation.

In exemplary embodiments the oxide and the metal are thoroughly mixed, and a body is formed from the mixture in any appropriate manner, e.g., by cold or hot pressing, extruding, tape casting, slip casting, or screen printing. The mixture can, for instance, be used in the preparation of a preform that can be drawn into (normal metal-clad) wire or tape, or formed into a body by any other appropriate process. The thus prepared body is then subjected to a heat treatment that results in substantial sintering of the mixture and in oxygenation of the sintered body such that, after completion of the heat treatment, a (relatively strong) superconductive oxide body results.

Although the mixing of metal powder with superconducting powder is a currently preferred way to form the material from which inventive metal-containing superconductive bodies are produced, other ways do exist. For instance, the metal can be added to the superconductive powder in the form of compounds such as oxides, carbides, nitrides, nitrates, fluorides, etc., provided that the compound decomposes during heat treatment (e.g., during sintering) such that the metal is distributed throughout the heat treated body. As an example, $Ag_2O$ or $AgNO_3$ powder can be added to (Ba, Y) cuprate powder in substantially the same way as Ag powder.

As will be appreciated by those skilled in the art, a metal or a metal compound can be added to the superconductive material in other than powder form. For instance, a slurry can be formed (with or without binder) and mixed with the superconductive powder. It is also possible to combine the superconductive powder with a melt or solution of the metal or compound (e.g., an alcohol solution of $AgNO_3$). In further exemplary embodiments the metal (or possibly metal-containing compound) can be co-deposited with the superconductive material (by, e.g., evaporation, sputtering, molecular beam epitaxy, chemical vapor deposition, electrodeposition, or electroless deposition) to form thin films, thick films, or even free-standing superconductive bodies. In a still further exemplary embodiment the metal is introduced into the superconductive material (e.g., a thin film) by ion implantation.

After producing a body that comprises an intimate mixture of superconductive material and metal (or metal compound), the body is heat treated to produce a metal-containing superconductive ceramic body. In many cases the heat treatment is substantially the same as used in making prior art superconductive oxide bodies. However, depending generally on the material property requirements and/or processing requirements, heat treatment conditions may be varied, including addition of further heat treatment steps. Under some conditions it may even be possible to eliminate the high temperature sintering step. For instance, if the metal forms a very thin interparticle layer that, in addition to mechanically bonding the particles together, assures good (either tunneling or normal) conduction between the superconducting particles, then sintering may not be required to produce a technologically useful superconductive body. By way of a further example, bodies produced by co-deposition of the superconductive compound and the metal may not require a heat treatment, or perhaps require only a relatively low temperature (e.g., below 600° C.) heat treatment. In many cases, however, the heat treatment will comprise maintaining the body for a period in the approximate range 1–24 hours at one or more temperatures in the approximate range 500–1100° C. (for (Ba, Y) cuprates preferably in the range 800–1000° C.), typically in an oxygen-containing atmosphere, and will further comprise slow cooling (not excluding one or more soaks at intermediate temperature) to a low temperature (e.g., 200° C.). The slow cool typically takes from about 4 to about 24 hours, and is typically also carried out in an oxygen-containing atmosphere. Provisions are made to insure that the superconductive oxide is in contact with the atmosphere, such that the desired oxygen level of the oxide can be attained.

We have found that the presence of a finely dispersed metal component in a superconductive body improves the mechanical properties (e.g., strength and/or toughness) of the body. A possible explanation for this advantageous effect is that the dispersed metal acts to inhibit crack growth.

We have also found that the presence of the dispersed metal component typically results in substantially increased (generally by at least a factor of 2) normal state (i.e., above the superconductive transition temperature) electrical conductivity, as compared to analogous prior art superconductive compound bodies. This has the advantage of providing micro-scale electrical stabilization. Furthermore, the presence of the dispersed metal component also increases the thermal conductivity of the material (both in the normal and in the superconductive state) and thus provides micro-scale thermal stabilization. As is well known to those skilled in the art, stabilization is needed for many of the commercially significant applications of superconductors, so as to prevent catastrophic failure.

The presence of a finely dispersed metal component in a superconductive compound body can result in further benefits. For instance, the metal particles can serve as grain growth inhibitor during heat treatment, or can serve as flux pinning centers. Both of these effects are likely to result in an increase of the critical current density $J_c$ of the superconductive material.

Not only does the presence of an appropriate dispersed metal in the superconductive material result in improved mechanical and other properties of the resulting superconductive body but it also can result in improved adherence of the superconductive body to a substrate. For instance, the substrate can be a silver coated glass plate or a silver foil. Firing a metal/superconductor body according to the invention on such a substrate typically results in bonding of the body to the substrate. In contrast thereto, many prior art pure oxide superconductive bodies do not adhere significantly to the substrate on which they were fired. This property of the inventive superconductive bodies can be expected to be of importance in many circumstances, e.g., to insure adhesion of screen printed superconductive bodies to their substrate. Improved adhesion is also expected for thin films according to the invention (e.g., sputter-deposited superconductive oxide films containing an appropriate metal component (e.g., Ag) on an appropriate substrate such as silver-coated alumina).

Figure 2:
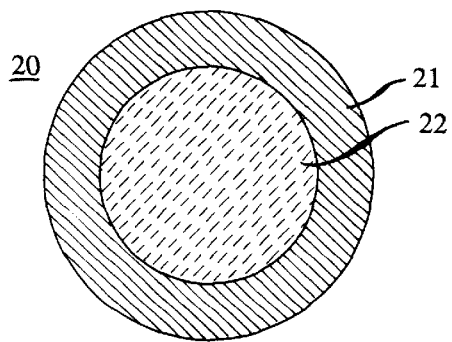
FIGS. 2, 3, 4, and 5 schematically depict exemplary inventive bodies.

FIGS. 2–5 schematically show exemplary bodies according to the invention in cross section. FIG. 2 depicts a clad wire or rod 20, with 22 being the superconductive material (e.g., (Ba, Y) cuprate and Ag) and 21 being the normal metal cladding (e.g., a Ag tube, or a composite comprising, for instance, a Ag inner layer, a Ni intermediate layer, and a Cu outer layer. Methods for producing such clad elongate bodies are disclosed in the above referred to U.S. patent application Ser. No. 034,117 and comprise drawing through dies. Subsequent to completion of the drawing (or other cross section-reducing operation) and prior to sintering the body generally is shaped into a desired form, e.g., wound into a coil. A wire or rod as shown in FIG. 2 may also comprise one or more protective coatings (not shown), e.g., electrical insulation.

Figure 4:
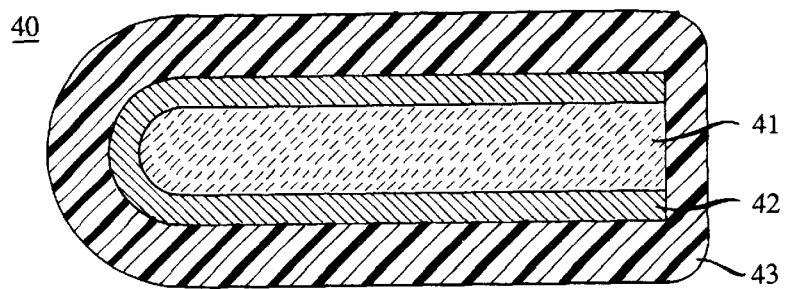

FIG. 4 shows a ribbon-like superconductive body 40, with 41 being the superconductive material (e.g., (La, Ba) cuprate and Ag), 42 is a normal metal cladding, and 43 is a polymer coating, applied subsequent to the heat treatment. Cladding 42 does not completely enclose 41, thereby providing ready access for $O_2$ during heat treatment. Such a ribbon can for instance be produced by first making a wire as shown in FIG. 2, rolling the wire in a conventional manner, and slitting or otherwise opening up one (or both) sides of the ribbon. After heat treatment the metal cladding typically will adhere well to the superconductive material.

Figure 3:
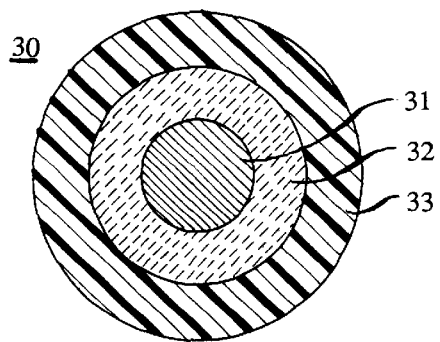

A further embodiment of the invention which benefits from improved adhesion is a superconductive wire or rod having one or more normal metal wires (or thin rods) embedded therein, generally in a longitudinal direction. An exemplary embodiment 30 is depicted in FIG. 3, in which 31 is a normal metal core, 32 is the superconductive material, and 33 is a polymer coating. The normal metal core (or cores) serves as a strength element, as well as providing electrical stabilization. Such a composite body has utility even if the superconductive material that surrounds the normal metal core (or cores) does not contain a metal component according to the invention and thus has relatively poor adhesion between the normal metal core and the superconductive material. However, such a composite body according to the invention in which the presence of an appropriate dispersed metal component in the superconductive material results, inter alia, in improved adhesion has substantially greater utility and may be advantageously used in applications such as power transmission.

Figure 5:
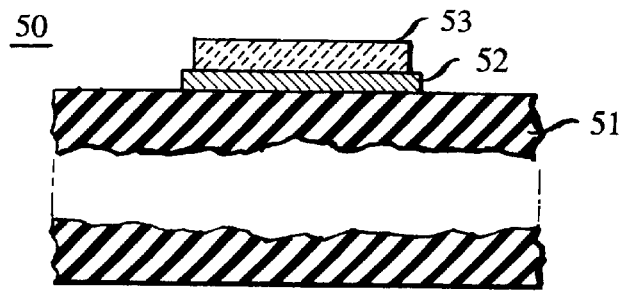

A still further embodiment of the invention is depicted in FIG. 5, in which 51 is a substrate (e.g., ceramic, $Al_2O_3$, Si), 52 is a (typically patterned) metal layer (e.g., Ag), and 53 is a superconductive body formed, for instance, by screen printing. Layer 52 insures adhesion and can serve to provide further electrical and thermal stabilization for the superconductor.

As will be appreciated by those skilled in the art, the inventive metal-containing superconductive material can be substituted for metal-free superconductive material (e.g., pure (Ba, Y) cuprate) in substantially all circumstances, and can typically be processed in substantially the same fashion as the metal-free material. Thus the inventive material can be advantageously used in all applications for which the prior art metal-free superconductive material is considered, and all such applications are contemplated by us.

Figure 6:
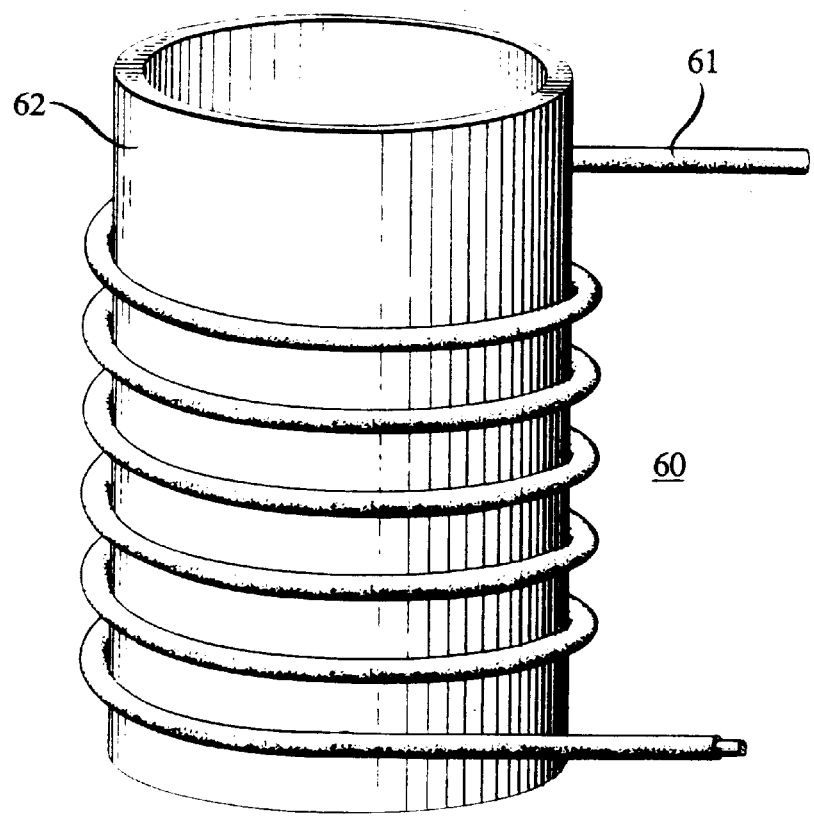
FIG. 6 schematically shows exemplary inventive apparatus, namely, a superconductive magnet.

Bodies according to the invention can be used advantageously in a variety of apparatus and systems. An exemplary apparatus, a superconductive solenoid 60, is shown schematically in FIG. 6, with 61 being a clad superconductive body according to the invention, and 62 being a tubular support body.

EXAMPLE I

Oxide powder of nominal composition $Ba_2YCu_3O_7$ was prepared substantially as described by R. J. Cava et al (op. cit.). The powder (average particle size 2.5 $\mu$m) was mixed with Ag powder (average particle size 1.3 $\mu$m) in the ratio 83/17% by volume, and formed into strips of approximate dimensions 0.125×1.250×0.040 inches by cold pressing and sintering in flowing $O_2$ at 930° C. for 2 hours, followed by furnace cooling in flowing $O_2$ to 300° C. The strips were all superconductive, with $T_c$ of about 93 K. Several of the strips were subjected to a standard 3 point bend test and were found to have average load of 4.8 lb at fracture. Identically shaped strips formed from the same oxide powder but without addition of Ag powder, fired and tested under identical conditions, had average load at fracture of 1.3 lb. The Ag-containing strips had normal state electrical resistivity (at about 100 K) of about 10 micro-ohm·cm, compared to a resistivity of about 275 micro-ohm·cm of the Ag-free strips.

EXAMPLE II (Ba, Y) cuprate powder is produced as described in Example I, mixed with Ag powder and a commercially available acrylic binder in 1, 1, 1 trichloroethane solvent (Cladan No. 73140 obtained from Cladan Inc., San Marcos, Calif.) to yield a volume ratio of 50% superconductor, 10% silver, 40% binder.

The thus produced slurry is poured into the reservoir of a doctor blade tape caster, with a gap 7.6 cm wide and 0.71 mm high. The slurry is cast in conventional fashion onto a PTFE-coated plate by moving the casting head cross 1.8 m of the plate at 1.8 cm/sec. The resulting strip of slurry is dried for 16 hours in air, yielding a flexible tape 112 $\mu$m thick and about 7.6 cm wide. A portion of the flexible tape is placed on a $ZrO_2$ substrate, covered with low density $Al_2O_3$ sheet that is coated with $ZrO_2$, and placed in a conventional muffle furnace. The tape is heated to 400° C. in 12 hours and held at that temperature for 12 hours in $O_2$. This results in substantially complete removal of the organic binder from the tape. The tape is then sintered by raising the temperature to 900° C. in 4 hours, holding at 900° C. for 5 hours, cooling to 600° C. in 4 hours, and cooling with the furnace to room temperature. The sintering treatment is carried out in 1 atmosphere of flowing oxygen. The resulting tape is approximately 0.1 mm thick, has $T_c$ of about 93 K, normal state resistivity that is substantially less than that of a corresponding metal-free superconductive tape. The inventive tape also has substantially greater strength than the corresponding metal-free tape.

EXAMPLE III

A screen printing ink is prepared by mixing cuprate powder, silver particles and binder substantially as described in Example II, except that the binder is a solution of ethylene cellulose binder in turpineol, and the volume ratio of binder, cuprate powder, and silver particles is about 30/25/5. The ink is screen printed in conventional manner onto a 1 $\mu$m thick Ag layer on a fused quartz substrate. The combination is heat treated substantially as described in Example I. The resulting superconductive body adheres strongly to the substrate, has $T_c$ of about 93 K, and normal state resistivity substantially lower than a corresponding metal-free superconductive body.

EXAMPLE IV

Superconductive strips are prepared substantially as described in Example I, except that the metal particles are Ag-coated Ni flakes (approximately 1×10 $\mu$m Ni flakes, 0.5 $\mu$m coating thickness, coated by a known electroless process), and the strips are sintered at 900° C. for two hours, followed by slow (6 hours) cooling to 200° C. The properties of the resulting superconductive strips are substantially as described in Example I.

EXAMPLE V 0.78 g of $AgNO_3$ is dissolved in 2 ml of distilled water, and the solution mixed with 1 g of $Ba_2YCu_3O_7$ powder of average particle size 0.5 μm. The resulting slurry is dried and pressed into pellet form. The pellet is fired substantially as described in Example I. The resulting superconductive body contains about 20% by volume Ag, has $T_c$ of about 93 K, and strength and normal state conductivity substantially higher than that of a corresponding metal-free superconductive pellet.

EXAMPLE VI

A superconductive body is produced by mixing $Ba_2YCu_3O_7$ powder, and silver particles in the ratio 83/17 by volume, and mixing the resulting powder with binder (produced by dissolving 20 g of polyvinylbutyral in 80 g of anhydrous ethyl alcohol) such that a paste results. The paste is extruded around a 0.5 mm silver wire through a 1.5 mm die in a conventional manner. The resulting green body is dried, wound helically onto a loose cylindrical mass of fibrous zirconia, and fired substantially as described in Example II. The resulting helical superconductive body has $T_c$ of about 93 K. The superconductive material adheres well to the Ag core, and has substantially greater strength and normal state electrical conductivity than the superconductive material of a corresponding metal-free superconductive helical body. The metal-containing helical superconductive body is then placed over a tubular core, thereby producing a superconductive solenoid.

What is claimed is:

1. Method of producing a body comprising a quantity of a superconductive material that comprises a first and a second component, the first component being an oxide and the second component comprising a metal distributed throughout at least a major portion of the oxide, the second component being at least about 1% by volume of the quantity of superconductive material;

CHARACTERIZED IN THAT the method comprises
   a) providing a quantity of solid oxide with a quantity of the second component or of a precursor of the second component (collectively to be referred to as the "additive") distributed therein;
   b) heat treating the oxide with the additive therein, the treatment comprising heating the oxide with the additive therein to a temperature above 500° C., at least part of the treatment being carried out in an oxygen-containing atmosphere such that the oxide is, or becomes, a superconducting oxide having a superconducting transition temperature greater than 77 K; wherein
   c) the additive is selected from the group consisting of silver, silver-coated base metal particles, and silver precursors, where by "silver precursor" is meant a silver compound which decomposes during step b) such that essentially only silver remains.

2. The method of claim 1, wherein said quantity of the second component consists substantially of a multiplicity of silver particles.

3. The method of claim 1, wherein said quantity of the second component comprises particles that have a base metal core and a silver coating surrounding the core.

4. The method of claim 1, wherein said quantity of the second component comprises silver flakes or silver filaments.

5. The body of claim 1, wherein the metal is an elongate body comprising a normal metal cladding that substantially encloses the quantity of second-component-containing superconductve material.

6. The method of claim 1, wherein the body is a patterned layer of the second-component-containing superconductive material on a substrate.

7. The metal of claim 6, wherein the substrate comprises a normal metal layer, with the patterned layer of the second-component-containing-superconductive material disposed on the normal metal layer.

8. Method of claim 1, wherein the oxide is a (Ba, Y) cuprate.

9. Method of claim 8, wherein the oxide is $YBa_2Cu_3O_x$ (x~7).

10. Method of a claim 8, wherein b) comprises heating the (Ba, Y) cuprate with the additive therein to a temperature of 900° C. or above.

11. Method of claim 1, wherein the silver precursor is selected from the group consisting of silver oxide, silver nitride, silver nitrate, and silver fluoride.

12. Method of claim 1, wherein the body comprises an elongate normal metal body (the "core"), with the quantity of superconductive material contactingly surrounding the core.

13. Method of claim 11, wherein the oxide is a (Ba, Y) cuprate, and wherein b) comprises heating the (Ba, Y) cuprate with the additive therein to a temperature in the range 800–1000° C.

14. A method of making a superconducting cermet having superconducting properties comprising the steps of:
   a) forming a structure of
      i) a superconducting ceramic material having the formula $RM_2Cu_3O_{(6.5+x)}$ wherein R is one or more rare earth elements capable of reacting to form a superconducting ceramic, M is one or more rare earth elements selected from barium and strontium capable of reacting to form a superconducting ceramic, x is greater than 0 and less than 0.5; and
      ii) a precious metal compound in solid form selected from the class consisting of oxides and halides of silver; and
      iii) heat treating the mixture at a temperature of about 800° C. to about 1000° C., said heat treatment carried out for a time less than 36 hours.

* * * * *